(12) United States Patent
Gajda et al.

(10) Patent No.: US 10,665,532 B2
(45) Date of Patent: May 26, 2020

(54) POWER APPARATUS

(71) Applicant: NEXPERIA B.V., Nijmegen OT (NL)

(72) Inventors: Mark A. Gajda, Nijmegen (NL);
Saurabh Pandey, Nijmegen (NL);
Ricardo L. Yandoc, Nijmegen (NL);
Yan Lai, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 0 days.

(21) Appl. No.: 15/944,855

(22) Filed: Apr. 4, 2018

(65) Prior Publication Data

US 2018/0286792 A1   Oct. 4, 2018

(30) Foreign Application Priority Data

Apr. 4, 2017   (EP) ..................................... 17164854

(51) Int. Cl.
*H01L 23/495* (2006.01)
*H01L 23/00* (2006.01)
*H01L 21/48* (2006.01)

(52) U.S. Cl.
CPC .... *H01L 23/49575* (2013.01); *H01L 21/4825* (2013.01); *H01L 23/4952* (2013.01); *H01L 23/49503* (2013.01); *H01L 23/49524* (2013.01); *H01L 23/49562* (2013.01); *H01L 24/40* (2013.01); *H01L 24/48* (2013.01); *H01L 24/72* (2013.01); *H01L 24/90* (2013.01); *H01L 2224/40137* (2013.01); *H01L 2224/48245* (2013.01); *H01L 2924/1033* (2013.01); *H01L 2924/10253* (2013.01); *H01L 2924/10272* (2013.01); *H01L 2924/13062* (2013.01);

(Continued)

(58) Field of Classification Search
CPC ......... H01L 23/49575; H01L 23/49524; H01L 23/4952; H01L 23/50; H01L 23/5286; H01L 23/585; H01L 21/4825; H01L 29/40; H01L 24/26; H01L 24/34; H01L 24/72; H01L 24/90; H01L 2224/40137; H01L 2224/28; H01L 2224/31; H01L 2924/13091; H01L 2924/13064; H01L 2924/13062; H01L 2021/60015

See application file for complete search history.

(56) References Cited

U.S. PATENT DOCUMENTS

| | | | |
|---|---|---|---|
| 8,395,364 B2 * | 3/2013 | Sato | H01L 23/4952 323/282 |
| 9,099,441 B2 * | 8/2015 | Otremba | H01L 21/50 |
| 9,496,207 B1 * | 11/2016 | Le | H01L 23/49575 |

(Continued)

*Primary Examiner* — David A Zarneke
(74) *Attorney, Agent, or Firm* — Ohlandt, Greeley, Ruggiero & Perle, L.L.P.

(57) ABSTRACT

Various aspects of the disclosure are directed to circuitry coupled for controlling current flow, such as in a cascode arrangement. As may be consistent with one or more embodiments, an apparatus includes a first transistor having a gate, source, channel and drain, and a second transistor having a gate, and having a stacked source, channel and drain. A conductive clip plate electrically connects the drain of the second transistor to the source of the first transistor, and another conductor electrically connects the source of the second transistor to the gate of the first transistor. The second transistor operates with the connecting structure to provide power by controlling the first transistor in an off-state and in an on-state.

16 Claims, 7 Drawing Sheets

(52) U.S. Cl.
CPC ............... *H01L 2924/13064* (2013.01); *H01L 2924/13091* (2013.01); *H01L 2924/30107* (2013.01)

(56) References Cited

U.S. PATENT DOCUMENTS

| | | | |
|---|---|---|---|
| 9,515,060 B2* | 12/2016 | Otremba | H01L 23/49575 |
| 10,128,174 B2* | 11/2018 | Padmanabhan | H01L 29/2003 |
| 2012/0250587 A1 | 10/2012 | Pandey et al. | |
| 2014/0145208 A1 | 5/2014 | Rose et al. | |
| 2014/0300410 A1 | 10/2014 | Büthker et al. | |
| 2016/0293563 A1* | 10/2016 | Fujino | H01L 24/36 |
| 2018/0182730 A1* | 6/2018 | Cho | H01L 23/492 |

\* cited by examiner

POWER APPARATUS

CROSS REFERENCE TO RELATED APPLICATIONS

The present application claims foreign priority to European Patent Application No. 17164854.6 filed on Apr. 4, 2017, the entirety of which is incorporated by reference hereby.

FIELD OF THE DISCLOSURE

Aspects of various embodiments are directed to the use of respective circuits operable for providing power, and to providing low inductance.

Various approaches are implemented for power circuits, such as power transistors that provide high switching frequencies and power conversion efficiency. Various such approaches employ cascode circuits, which may involve respective transistors arranged separately and connected by wire bonding.

While useful, many power circuits exhibit issues relating to connectivity, such as connectivity involving the use of wires. For instance, internal inductance can be undesirably high, switching losses may be present, operating frequency can be limited, and operating temperature can be limited.

These and other matters have presented challenges to power savings and operability of circuitry, for a variety of applications.

SUMMARY OF THE DISCLOSURE

Various example embodiments are directed to addressing issues such as those noted above and/or others which may become apparent from the following disclosure, and including issues relating to power circuits.

As may be implemented with one or more embodiments, an apparatus and/or method involves a first transistor having a gate, source, channel and drain, and a second transistor having a gate, and having a stacked source, channel and drain. A conductive clip plate electrically connects the drain of the second transistor to the source of the first transistor, and another conductor electrically connects the source of the second transistor to the gate of the first transistor. The second transistor operates with the connecting structure to provide power by controlling the first transistor in an off-state and in an on-state.

In accordance with particular embodiments, a power apparatus includes a high-voltage and low-voltage power transistors, each having a gate, source, channel and drain. The apparatus also includes a planar conductive clip plate that connects the drain of the low-voltage power transistor to the source of the high-voltage power transistor, and a conductor that electrically connects the source of the low-voltage power transistor to the gate of the high-voltage power transistor. The planar conductive clip plate has a first planar surface region that interfaces with a planar surface region of the source of the high-voltage power transistor, and a second planar surface region that interfaces with a planar surface region of the drain of the low-voltage power transistor. This provides conductive path that connects the source of the high-voltage power transistor with the drain of the low-voltage power transistor via the interfacing at the first and second surface regions. In various embodiments, the apparatus also includes control circuitry configured and arranged with the low-voltage power transistor and the conductor to control the high-voltage power transistor in an on-state and in an off-state, by selectively applying a voltage from the source of the low-voltage power transistor to the gate of the high-voltage power transistor. This voltage is supplied via the application of a voltage control signal to the gate of the low-voltage power transistor. The apparatus may further be coupled to a drain terminal, source terminal, gate terminal, and additional planar conductive clip plates that respectively connect the drain terminal to the drain of the high-voltage power transistor, the source terminal to the source of the low-voltage power transistor, and the gate terminal to the gate of the of the low-voltage power transistor, the control circuitry being electrically connected to the gate terminal.

Various embodiments are directed to a method as follows. A first transistor having a gate, source, channel and drain is formed, along with a second transistor having a gate, and having a stacked source, channel and drain. A connecting structure is formed including a conductive clip plate that electrically connects the drain of the second transistor to the source of the first transistor, and a conductor that electrically connects the source of the second transistor to the gate of the first transistor. For instance, the transistors can be formed with a gap therebetween, and with the source of the first transistor being coplanar with the drain of the second transistor, facilitating connection via the conductive clip plate. The second transistor is configured with the connecting structure to provide power by controlling the first transistor in an off-state and in an on-state. In some implementations, the conductive clip plate is formed as a planar plate having respective surface regions that interface with a surface region of the source of the first transistor and with a surface region of the drain of the second transistor.

Various embodiments are directed to a power apparatus comprising: a high-voltage power transistor having a gate, source, channel and drain; a low-voltage power transistor having a gate, source, channel and drain; a planar conductive clip plate having a first planar surface region that interfaces with a planar surface region of the source of the high-voltage power transistor, having a second planar surface region that interfaces with a planar surface region of the drain of the low-voltage power transistor, and providing a conductive path that connects the source of the high-voltage power transistor with the drain of the low-voltage power transistor via the interfacing at the first and second surface regions; a conductor that electrically connects the source of the low-voltage power transistor to the gate of the high-voltage power transistor; and control circuitry configured and arranged with the low-voltage power transistor and the conductor to control the high-voltage power transistor in an on-state and in an off-state, by selectively applying a voltage from the source of the low-voltage power transistor to the gate of the high-voltage power transistor, via the application of a voltage control signal to the gate of the low-voltage power transistor.

The power apparatus may further include a drain terminal, a source terminal, a gate terminal, and additional planar conductive clip plates that respectively connect: the drain terminal to the drain of the high-voltage power transistor, the source terminal to the source of the low-voltage power transistor, and the gate terminal to the gate of the of the low-voltage power transistor, the control circuitry being electrically connected to the gate terminal.

The above discussion/summary is not intended to describe each embodiment or every implementation of the present disclosure. The figures and detailed description that follow also exemplify various embodiments.

BRIEF DESCRIPTION OF THE DRAWINGS

Various example embodiments may be more completely understood in consideration of the following detailed description in connection with the accompanying drawings, in which.

Figure 1:
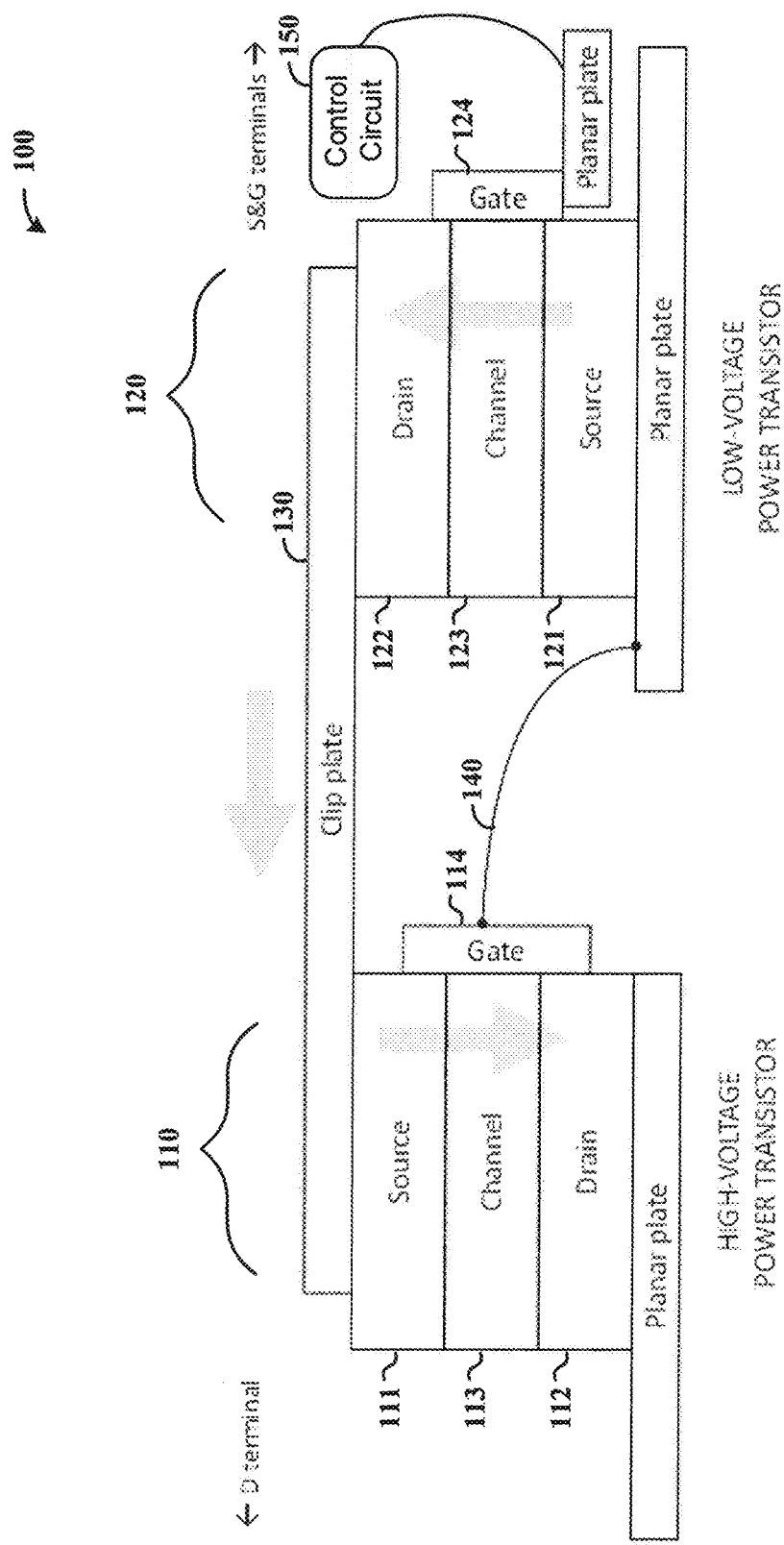
FIG. 1 is a cross-sectional view of a power circuit, as may be implemented in accordance with embodiments of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving the utilization of circuitry connected for providing various functions, such as power supply. In certain implementations, aspects of the present disclosure have been shown to be beneficial when used in the context of cascode circuitry and related devices in which respective transistors are connected to provide desirable switching frequencies in power applications. While not necessarily so limited, various aspects may be appreciated through the following discussion of non-limiting examples and the corresponding contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various embodiments are directed toward low-inductance cascode circuits and related positioning of components that facilitates low-inductance operation. In some implementations, transistors are connected in cascode using a clip structure (e.g. clip-bonding) to couple the transistors. Such a clip structure may, for example, be implemented with a conductive plate extending between respective source and drain nodes of transistors connected in series. Additional plate-type structures can be used for gate and source/drain contacts. In various implementations, such plate-type structures are used in place of wire bonds that would otherwise exhibit high inductance, with the respective circuits being arranged to facilitate such connection. In particular embodiments, adjacent transistors are manufactured in a stack-type arrangement and flipped relative to one another in which the source of one transistor is in a common plane with the drain of an adjacent transistor, with a clip connecting the transistors.

Certain embodiments are directed to high-voltage power transistors, such as those based on GaN and SiC materials that allow higher switching frequencies and desirable power conversion efficiency in, for example, hard-switching circuit topologies. Such power transistors can be arranged in a cascode circuit with a low-voltage transistor (e.g., a Si enhancement-mode power MOSFET) operative to control the power transistor. The high-voltage power transistor can thus be implemented as a normally-on transistor with the low-voltage transistor being used to control the high-voltage power transistor in the on-state, and in the off-state when power is not to be provided. Clip-type contacts/pins and interconnections between the high-voltage power transistor (e.g., depletion-mode GaN HEMT or SiC JFET) and the low-voltage transistor (e.g., Si MOSFET) can be used in place of bond wires, with the respective transistors arranged accordingly (e.g., the source of the high-voltage power transistor connected to the drain of the low-voltage transistor in a cascode circuit). These clip-type connections can be used to mitigate internal inductance that can be added by wires, and address various issues as described herein. Particular embodiments are directed toward utilizing vertical power devices utilizing clip-bond and flip-chip technology, with adjacent power and low-voltage transistors being flipped relative to one another. Such vertical power devices can be utilized in the 650V and higher voltage application space. Such an approach can take advantage of native low Rds(on) of the circuits.

Embodiments herein may be implemented for a multitude of disparate power supply applications. For example, certain embodiments are directed to implementation with products provided by NXP Semiconductor of Eindhoven, The Netherlands. For instance, packages as noted herein can be implemented with power quad flat no-lead packages such as described in the NXP Semiconductors Application Note number AN2467 (Rev. 5.0, 7/2016) which is fully incorporated herein by reference. Packages herein can also be implemented with TO220-style of packages, such as with the TO-220F package (characterized by the JDEC Solid State Technology Association). Various embodiments may be provided for implementation with cascode-type circuits, and consistent with applications and/or circuitry disclosed in one or more of the following U.S. Patent Publications: 2014/0145208, 2014/033410, and 2012/0250587, all of which are fully incorporated herein by reference. For example, cascode circuits can be implemented to facilitate full duplex communication as noted in the latter of the three publications. In these contexts, a cascode circuit as noted herein refers to a circuit having respective transistors electrically arranged in series and sharing a common source/drain region.

One or more embodiments are directed to an apparatus (or method of making or operating such an apparatus) involving a first transistor having a gate, source, channel and drain, and a second transistor having a gate, and having a stacked source, channel and drain. A conductive clip plate is electrically connected to the drain of the second transistor and to the source of the first transistor. Another conductor electrically connects the source of the second transistor to the gate of the first transistor. The second transistor is configured and arranged to operate with the connecting structure to provide power by controlling the first transistor in an off-state and in an on-state. For instance, the second transistor can, via control of its gate, control a voltage presented from its source to the gate of the first transistor.

In the context of the various embodiments characterized herein, the term clip plate refers to a connector having a plate, such as a planar plate having upper and lower surfaces and connecting electrical components, such as a source and drain of respective transistors. The term clip plate does not refer to a wire bond, such as a single wire extending from a pad and to another electrical component. In certain embodiments, a conductive clip plate, source of the first transistor and drain of the second transistor are conductive plates having upper and lower surfaces defined by a length and a width. The width of the conductive clip plate is about equal to a width of one of the source of the first transistor and the drain of the second transistor.

The transistors can be arranged in a stacked structure or a lateral structure, to suit particular embodiments. In some embodiments, the source, channel and drain of the first transistor are stacked. In other embodiments the source, channel and drain of the second transistor are stacked. In yet other embodiments, the source, channel and drain of both transistors are stacked, and the first and second transistors are inverted relative to one another. The transistors are arranged laterally adjacent one another with a gap therebetween, with the first and second transistors are connected to form a cascode circuit. The conductive clip plate includes a planar plate that extends laterally across the gap with opposing edges of the plate being respectively connected to the source of the first transistor and to the drain of the second transistor.

A variety of physical arrangements can be effected with the conductive platers. In some embodiments, the source and the drain of the first and second transistors include and/or are connected to planar plates that extend out to form an external contact. The drain of the first transistor and the source of the second transistor are on a common substrate and electrically isolated from one another and the source of the first transistor and the drain of the second transistor have respective edges of the planar plates that are connected along the respective opposing edges of the planar plate of the conductive clip plate. In some implementations, the apparatus is arranged in stacked layers in which a first layer includes the respective conductive plates for each of the drain of the first transistor, the source of the second transistor and the gate of the second transistor, a second layer includes the respective channels of the first transistor and the second transistor; and a third layer includes the source of the first transistor, the conductive clip plate and the drain of the second transistor. In such implementations, the second layer is configured and arranged with the first and second layers to control a conductive state of each of the transistors based upon voltages applied to the respective gates. In a further implementation, the conductive plates of the first layer have upper planar surfaces, each of the respective channels have upper and lower planar surfaces with the lower planar surfaces respectively being on the upper planar surface of an underlying one of the conductive plates of the first layer, and each of the conductive plates of the third layer have lower planar surfaces respectively on the upper planar surface of an underlying one of the respective channels.

In certain embodiments in which the source, drain and channel of the first transistor are arranged laterally, these components are supported with a lower surface of the clip plate being in contact with upper surfaces of the source of the first transistor and of the drain of the second transistor. In some implementations, the first and second transistors are formed on an upper surface of a common supporting structure, and the apparatus includes a substrate on the upper surface of the common supporting structure with the source, drain and channel of the first transistor arranged laterally over the substrate and in a common layer with the drain of the second transistor. In a further implementation, the common supporting structure is conductive, the conductor is connected from the common supporting structure to the gate of the first transistor, and the common supporting structure provides an electrical path connecting the conductor to the source of the second transistor.

The arrangement of the transistors and related components can be set to suit particular embodiments. Various of the following embodiments characterize such applications. In some embodiments, the first and second transistors are arranged relative to one another with the source of the first transistor, conductive clip plate and gate of the second transistor including conductive plates arranged in a common plane. In certain embodiments in which the first and second transistors are inverted relative to one another, the source of the first transistor, conductive clip plate and gate of the second transistor as conductive plates arranged in a common plane. In some embodiments, the source and the drain of each of the first and second transistors are or include planar plates, the drain of the first transistor and the source of the second transistor are on a common substrate and electrically isolated from one another, and the source of the first transistor and the drain of the second transistor are arranged in a common plane with the conductive clip plate.

The apparatus is arranged in stacked layers for certain embodiments in which a first such layer includes the drain of the first transistor, the source of the second transistor and the gate of the second transistor, a second such layer includes the respective channels of the first transistor and the second transistor, and a third such layer includes the source of the first transistor, the conductive clip plate and the drain of the second transistor, with the second layer being configured and arranged to control a conductive state of each of the transistors based upon voltages applied to the respective gates.

A further embodiment involves such layers with a first layer having respective conductive plates for each of the drain of the first transistor, the source of the second transistor and the gate of the second transistor, a second layer stacked on the first layer and including the respective channels of the first transistor and the second transistor, and a third layer stacked on the second layer and including the source of the first transistor, the conductive clip plate and the drain of the second transistor. The second layer is disposed between the first layer and the second layer and configured and arranged therewith to control a conductive state of each of the transistors based upon voltages applied to the respective gates Another embodiment is directed to an apparatus as noted herein, in which a first transistor is a normally-on power transistor and a second transistor is a low-voltage transistor configured and arranged to switch between an on-state and an off-state at a lower voltage than a voltage at which the first transistor switches between an on-state and an off-state. The low-voltage transistor controls the normally-on power transistor in an off-state by applying a voltage to the gate of the first transistor.

Turning now to the figures, FIG. 1 shows a cross-sectional view of a power circuit 100, as may be implemented in accordance with embodiments of the present disclosure. The power circuit 100 includes a first transistor 110 and second transistor 120, having a source-drain connection implemented with a clip plate 130. The clip plate 130 facilitates a low-impedance connection between the otherwise separated transistors, and can mitigate issues such as those discussed above relative to higher-inductance connections.

In some implementations, the respective transistors 110 and 120 are vertical transistors, shown in FIG. 1 by way of example, and may also be inverted relative to one another. Transistor 110 includes a source 111, drain 112 and channel 113. Transistor 120 includes source 121, drain 122 and channel 123, with a gate 124 adjacent the channel. This inverted positioning facilitates the utilization of the clip plate 130 to couple the respective source and drain as inverted relative to one another. This approach may also facilitate implementation of the clip plate 130 in a common plane with the source 111 and drain 122. In various manufacturing embodiments, these three components may be manufactured from a common conductive material, or otherwise in a common layer (e.g., with different materials).

The apparatus 100 can be implemented for power applications. In some embodiments, the transistor 110 is a high-voltage power transistor and transistor 120 is a control (e.g., low-voltage) transistor that controls operation of the high-voltage power transistor. For instance, the source 121 can be connected to a gate 114 that controls operation of the power transistor 110, using a connector 140. The connector 140 may, for example, be implemented as a wire bond, or as a clip-type structure. In certain embodiments, transistor 110 is a normally-on power transistor, and transistor 120 provides voltage at its source 121 to maintain the gate 114 biased such that the power transistor 110 is in an off-state. When the apparatus is desirably switched on, the low-voltage transistor 120 can be switched, such as by using a control circuit 150 to apply a voltage to the gate 124, such that the bias applied to the gate 114 and/or source 111 is removed or otherwise altered so that the normally-on characteristics of the power transistor 110 take over and the device begins to conduct.

Figure 2A:
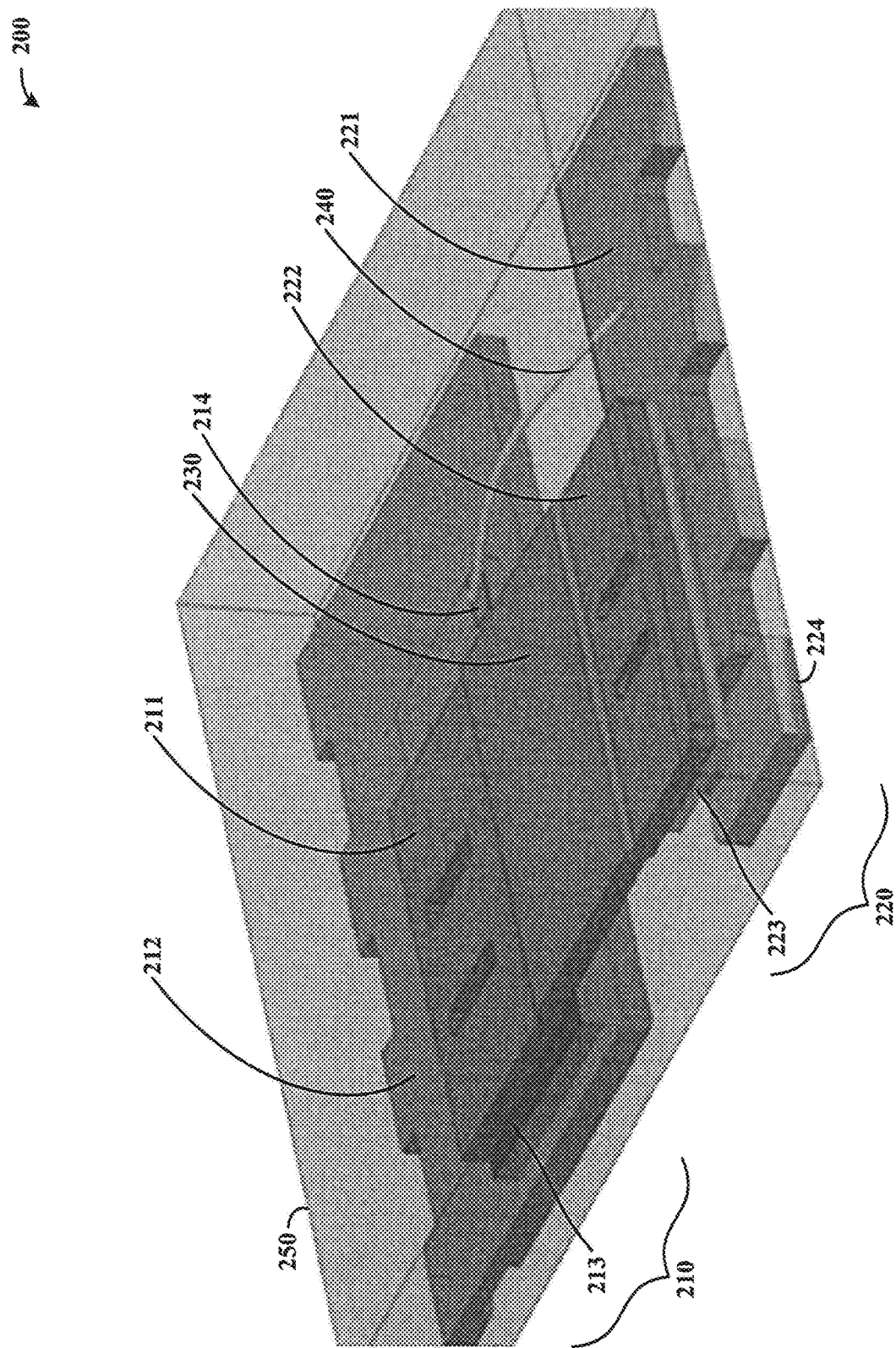
FIG. 2A is a perspective view of a power circuit having respective vertical transistors, as may be implemented in accordance with embodiments of the present disclosure.
Figure 2B:
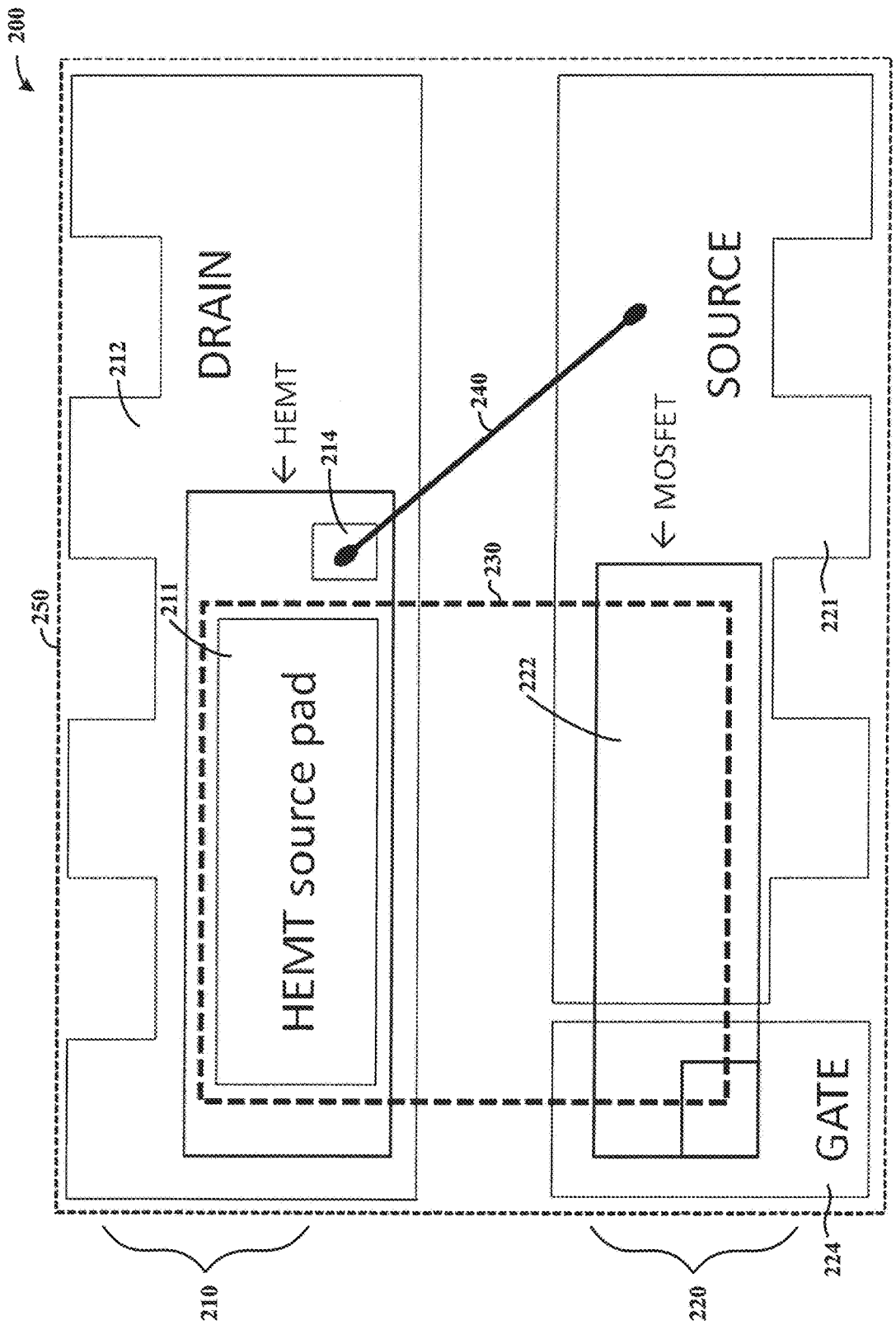
FIG. 2B shows a top view of the apparatus of FIG. 2A, in accordance with one or more embodiments.

FIG. 2A is a perspective view, and FIG. 2B is a top view of a power circuit apparatus 200, as may be implemented in accordance with embodiments of the present disclosure. The circuit 200 includes respective transistors in a cascode package based on clip-bond technology, which can be implemented in various manufacturing scenarios (e.g., in an 8×8 mm surface mount outline). In particular, the circuit 200 includes stacked transistors 210 and 220 arranged in an inverted-stack relationship relative to one another. By way of example, FIG. 2B represents an embodiment with transistor 210 being implemented as a high voltage HEMT, and transistor 220 implemented as a low-voltage MOSFET. Transistor 210 (e.g., a high-voltage depletion-mode SiC or GaN transistor) includes source 211, drain 212, channel 213 and gate 214. Transistor 220 (e.g., a low-voltage enhancement Si MOSFET) includes source 221, drain 222, channel 223 and gate 224. A clip 230 connects the source 211 of the first transistor to the drain 222 of the second transistor, and a wire bond 240 connects the source 221 of the second transistor to the gate 214 of the first transistor. The second transistor 220 acts to selectively control the first transistor 210 in an off state as well as in an on-state, and therein control power supplied through the apparatus 200.

The apparatus 200 can be manufactured in a variety of manners. In some embodiments, respective layers are formed/patterned to provide the stacked circuits as shown. For instance, a first layer can be formed with the drain 212, source 221 and gate 224 on a common substrate. Channel dielectrics 213 and 223 can be respectively formed in a second layer on upper surfaces of the drain 212 and source 221. The source 211 and drain 222 can be formed in a third layer on the channel dielectrics along with clip 230 therebetween. Gate 214 can be integrated with the first and/or second layers, and arranged to bias a portion of the channel 213 between the source 211 and drain 212. Using this approach, all connections to the apparatus 200 and between the respective transistors are of a clip or plate type connector, with the exception of the bond wire 240. Further, by using the clip or plate type structures for the drain 212 and the source 221, external connections to the apparatus can be made via these components, eliminating inductances that may otherwise be associated with wire bonds to external contacts. Various flip-chip and clip-bond technology can be implemented for the manufacture of the apparatus 200. Terminal connections can be over-molded (hidden) as shown with over-mold 250, and/or conventionally molded (exposed).

Figure 3:
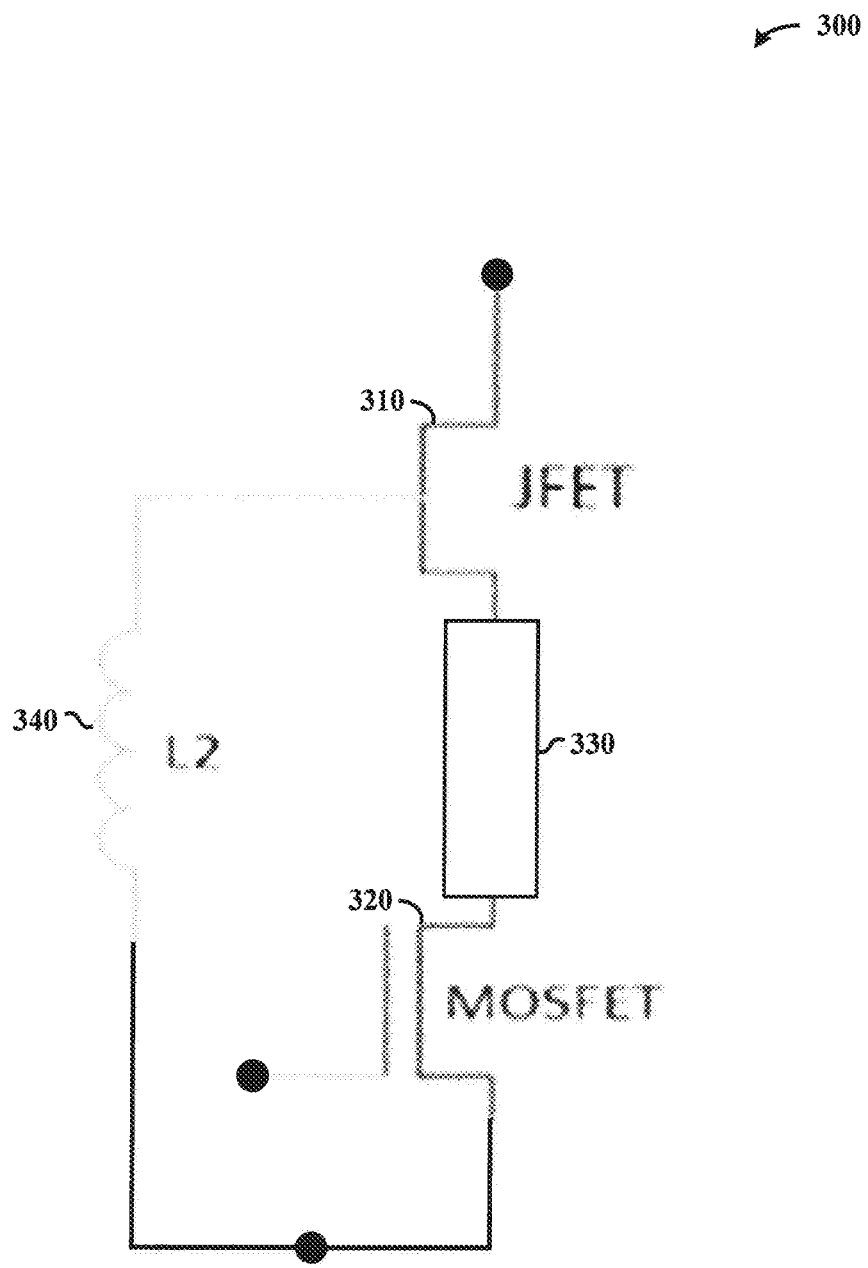
FIG. 3 shows a power circuit, as may be implemented in accordance with embodiments of the present disclosure.

FIG. 3 shows a power circuit 300, as may be implemented in accordance with embodiments of the present disclosure. The power circuit 300 may, for example, be implemented using one or more approaches consistent with FIG. 2. The power circuit 300 includes a high-voltage power transistor 310, a low-voltage (control) transistor 320, and connecting clip structure 330 that couples the power transistor to the low-voltage transistor (e.g., source to drain). By way of example, the high-voltage power transistor 310 is labeled as a JFET, and the low-voltage transistor 320 is labeled as a MOSFET. A connector 340 couples a source of the low-voltage transistor 320 to the gate of the high-voltage transistor 310.

In connection with one or more embodiments herein, it has been recognized/discovered that utilizing package arrangement and related clip or plate type connectors facilitates a reduction in inductances. Table 1 illustrates exemplary package inductance reductions that can be achieved in accordance with one or more embodiments, employing a low-voltage (LV) control transistor and a high-voltage power transistor.

TABLE 1

Calculated inductances for wired and clip-bonded packages

| Inductance | Wire | Clip-bond |
|---|---|---|
| External connection to power transistor | Tab | Tab |
| LV transistor gate contact wire | 1.5 nH | Pin/0 nH |
| Ground/reference pin contact wire | Pin | Pin |
| Source-Drain between transistors | 1.4 nH | 0.64 nH |

TABLE 1-continued

Calculated inductances for wired and clip-bonded packages

| Inductance | Wire | Clip-bond |
|---|---|---|
| Ground/reference pin to power transistor gate | 1.5 nH | 2.4 nH → 1.3 nH* |
| LV source to ground/reference pin | 3.5 nH | 0 nH |

*May use a ~300 μm wire diameter

Using the above approach, switching energy losses can be significantly reduced. Further, clip-bonding can reduce overall product resistance and inductance, as may be relevant to (but not restricted to) products with a saturation resistance Rds(on)<300 mohm. Further, the clip type structures can facilitate cooling, reduce manufacturing cost associated with wires, permit higher temperature operation, and facilitate manufacturing assembly automation.

Figure 4A:
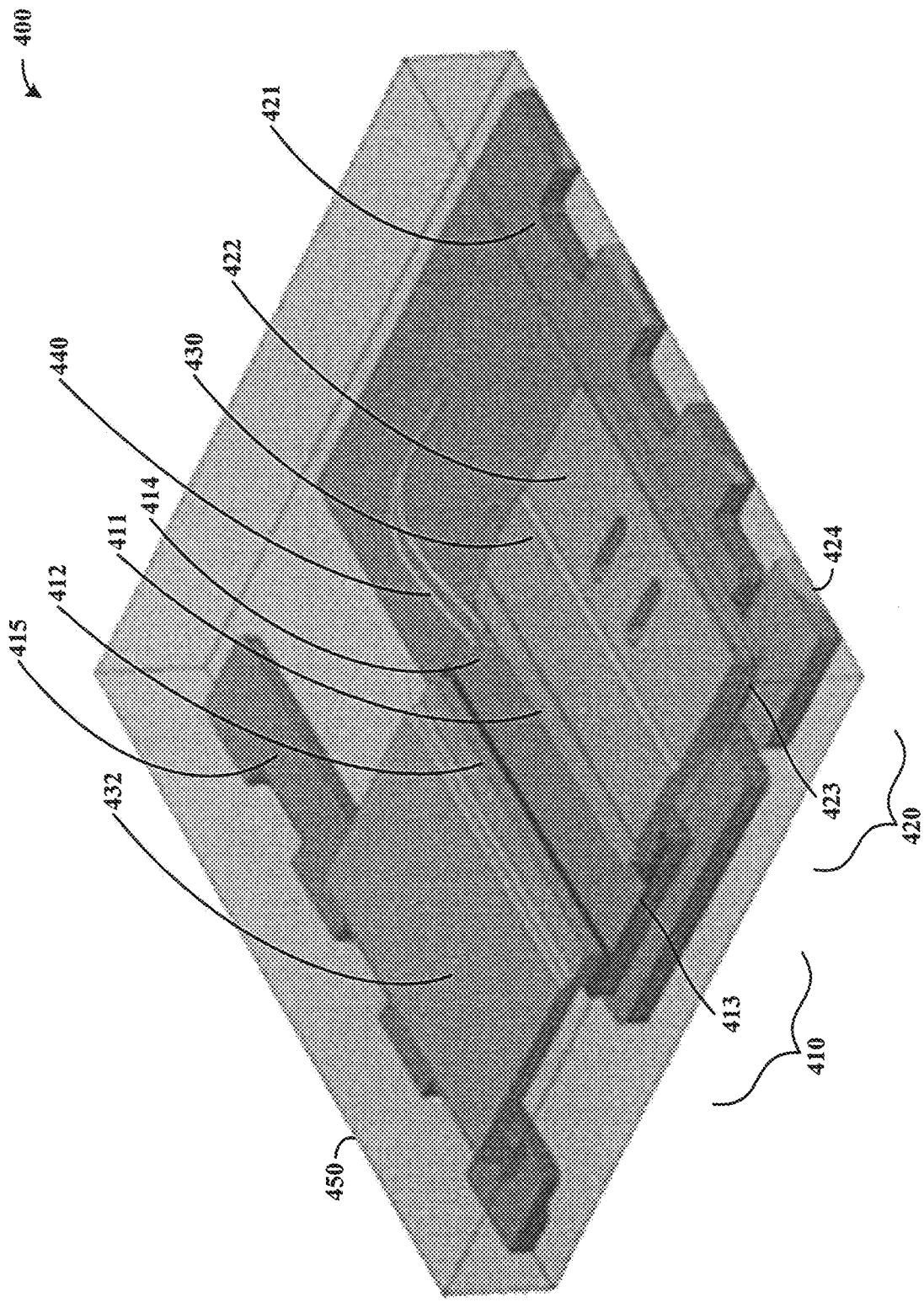
FIG. 4A is a perspective view of another power circuit having vertical and lateral transistors, as may be implemented in accordance with embodiments of the present disclosure.
Figure 4B:
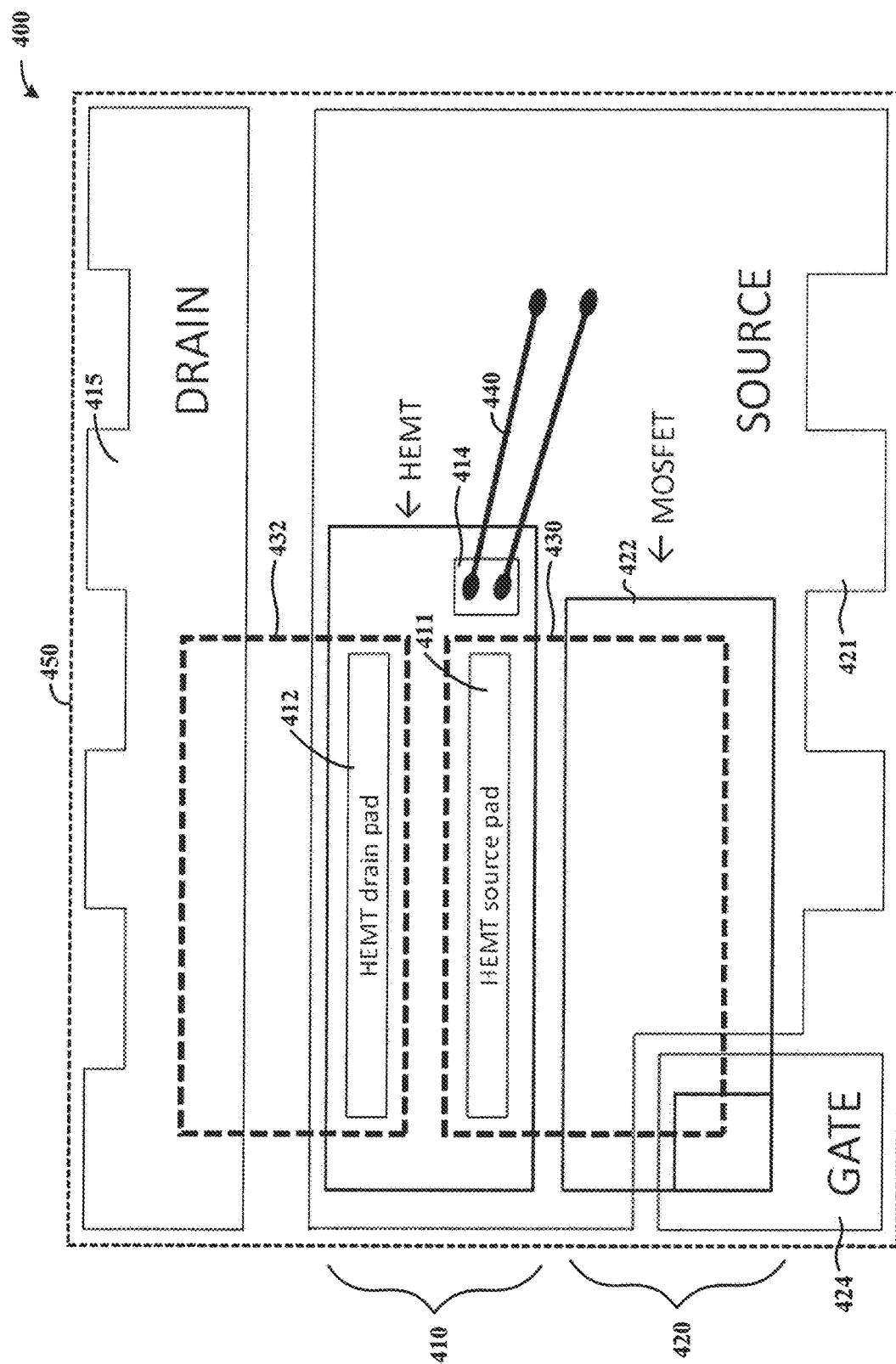
FIG. 4B shows a top view of an apparatus having vertical and lateral transistors, in accordance with one or more embodiments.

FIG. 4A is a perspective view and FIG. 4B is a top view of another power circuit apparatus 400, employing vertical and lateral transistors, as may be implemented in accordance with embodiments of the present disclosure. The apparatus 400 includes a lateral high-voltage power transistor 410 having a source 411, drain 412 (pad), channel 413 and gate 414 (as may be located adjacent and/or below the channel). The apparatus also includes a vertical low-voltage transistor 420 having source 421, drain 422, channel 423 and gate 424. A clip structure 430 connects the drain 422 to the source 411, a clip structure 432 connects the drain 412 to drain contact 415, and a wire 440 connects the source 421 to the gate 414. The apparatus 400 may include an over-molding 450, or exhibit exposed wires/connectors.

Figure 5:
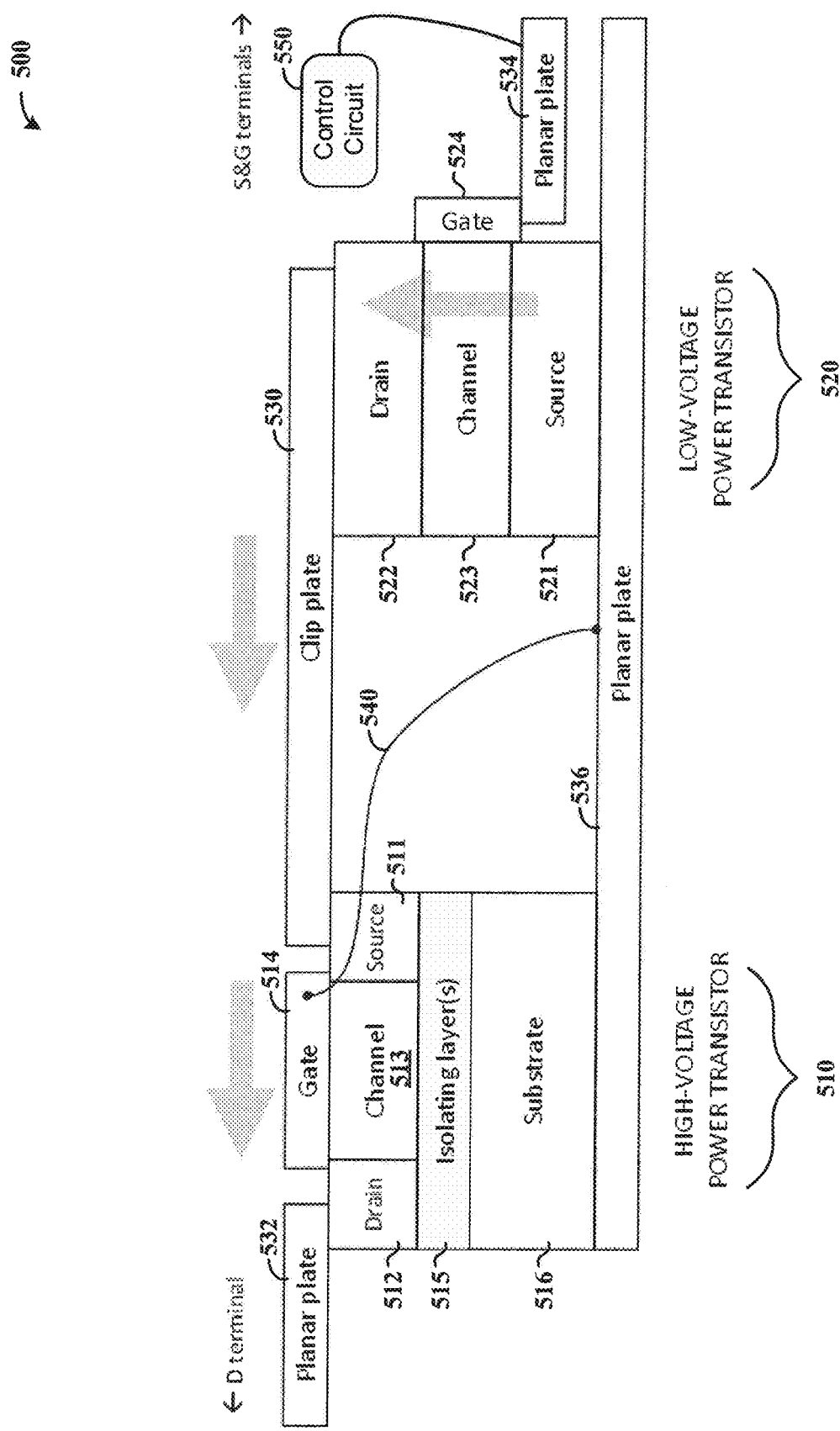
FIG. 5 shows a cross-sectional view of an apparatus, in accordance with one or more embodiments.

FIG. 5 shows a cross-sectional view of an apparatus 500 having vertical and lateral transistors, in accordance with one or more embodiments. The apparatus 500 may, for example, be implemented using an approach similar to that noted in FIG. 4, with mixed mode operation in which the high-voltage transistor uses lateral current flow and the low-voltage transistor uses vertical flow. A high-voltage power transistor 510 is implemented laterally with source 511, drain 512 and channel 513 as shown, on an underlying isolating layer 515 and substrate 516 and with gate 514 on the channel. A low-voltage power transistor 520 is implemented vertically with source 521, drain 522 and channel 523 stacked as shown and with gate 524 alongside the channel. A clip plate 530 connects the source 511 to drain 522, and a connector 540 completes an electrical connection between the source 521 and the gate 514 (via plate 536). Other planar plates can also be implemented, such as plate 532 for connecting the drain 512 to a drain terminal, plate 534 for connecting gate 524 to a gate terminal, and plate 536 for connecting the source 521 to a source terminal (and, e.g., utilized as a support upon which the structure may be formed). The low-voltage power transistor 520 controls the operation of the high-voltage transistor 510, which can be effected using a control circuit 550 that provides a voltage for operating the gate 524 and therein controlling the selective application of a voltage from the source 521 to gate 514, for controlling the high-voltage power transistor 510 in an on-state and in an off-state (e.g., with voltage respectively not applied/floating and voltage applied).

Terms that indicate orientation, such as upper/lower, left/right, top/bottom and above/below, may be used herein to refer to relative positions of elements as shown in the figures. It should be understood that when the terminology is used for notational convenience, the disclosed structures may be oriented different from the orientation shown in the figures. For instance, high-voltage power transistors and low-voltage transistors can be flipped relative to one another in opposing stacked arrangements.

The specification describes and/or illustrates aspects useful for implementing the claimed invention(s) by way of various circuits or circuitry, which may be discussed or otherwise considered using terms such as blocks, modules, device, system, unit, controller, comparator, and other circuit-type depictions. Such circuits or circuitry are discussed in connection with other elements to explain how certain embodiments may be carried out. For example, in certain of the above-discussed embodiments, one or more illustrated items in this context represent circuits (e.g., discrete analog or logic circuitry or (semi-)programmable circuits) configured and arranged for implementing disclosed operations/activities, as may be carried out in the approaches shown in the figures.

Based upon the above discussion and illustrations, those skilled in the art will readily recognize that various modifications and changes may be made to the various embodiments without strictly following the exemplary embodiments and applications illustrated and described herein. For example, certain connectivity and relative arrangements of circuitry can be provided as shown, or can be altered to achieve a similar effect. Such an approach may involve using transistors with different source/drain connections (e.g., with a low-voltage power transistor having its source connected to the drain of a high-voltage power transistor, and it's drain connected to a gate of the high-voltage power transistor). Further, other stacked and lateral transistor arrangements can be used, such as to provide respective lateral transistors (e.g., both high-voltage and low-voltage transistors similar to transistor 510 in FIG. 5). As another example, methods as described in connection with the figures may involve steps carried out in various orders, with one or more aspects of the embodiments herein retained, or may involve fewer or more steps. Such modifications do not depart from the true spirit and scope of various aspects of the disclosure, including aspects set forth in the claims.

The invention claimed is:

1. An apparatus comprising:
a first transistor having a gate, a source, a channel and a drain;
a second transistor having a gate, and having a stacked source, a channel and a drain;
a connecting structure including a conductive clip plate configured to electrically connect the drain of the second transistor to the source of the first transistor, wherein the conductive clip plate includes a planar plate that extends laterally across the gap with opposing edges of the plate being respectively connected to the source of the first transistor and to the drain of the second transistor; and
a wired or clip-bonded conductor that electrically connects the source of the second transistor to the gate of the first transistor;
the second transistor being configured and arranged with the connecting structure to provide power by controlling the first transistor in an off-state and in an on-state.

2. The apparatus of claim 1, wherein the apparatus further comprises:
the source, channel and drain of the first transistor being stacked,
the first and second transistors are inverted relative to one another, arranged laterally adjacent one another with a gap therebetween, and wherein the first and second transistors are connected to form a cascode circuit.

3. The apparatus of claim 1, wherein:
the source and the drain of each of the first and second transistors comprise a plurality of planar plates;
the drain of the first transistor and the source of the second transistor are on a common substrate and electrically isolated from one another; and
the source of the first transistor and the drain of the second transistor have respective edges of the planar plates that are connected along the respective opposing edges of the planar plate of the conductive clip plate.

4. The apparatus of claim 1, wherein the apparatus is arranged in stacked layers comprising:
a first layer that comprises respective conductive plates for each of the drain of the first transistor, the source of the second transistor and the gate of the second transistor;
a second layer that comprises the respective channels of the first transistor and the second transistor; and
a third layer that comprises the source of the first transistor, the conductive clip plate and the drain of the second transistor, the second layer being configured and arranged with the first and second layers to control a conductive state of each of the first and second transistors based upon voltages applied to the respective gates.

5. The apparatus of claim 4, wherein the apparatus further comprises:
the conductive plates of the first layer having upper planar surfaces;
each of the respective channels of the first transistor and the second transistor included in the second layer having upper and lower planar surfaces, with the lower planar surfaces respectively being on the upper planar surface of an underlying one of the conductive plates of the first layer; and
each of the conductive plates of the third layer having lower planar surfaces respectively on the upper planar surface of an underlying one of the respective channels of the first transistor and the second transistor included in the second layer.

6. The apparatus of claim 1, wherein the source, drain and channel of the first transistor are arranged laterally and supported with a lower surface of the conductive clip plate, the conductive clip plate being in contact with upper surfaces of the source of the first transistor and of the drain of the second transistor.

7. The apparatus of claim 1, wherein the apparatus further comprises:
the first and second transistors being formed on an upper surface of a common supporting structure, and
the apparatus further comprises a substrate on the upper surface of the common supporting structure,
wherein the source, drain and channel of the first transistor are arranged laterally over the substrate and in a common layer with the drain of the second transistor.

8. The apparatus of claim 7, wherein the common supporting structure is conductive, the conductor is connected from the common supporting structure to the gate of the first transistor, and the common supporting structure provides an electrical path connecting the conductor to the source of the second transistor.

9. The apparatus of claim 1, wherein the first and second transistors are arranged relative to one another with the source of the first transistor, conductive clip plate and gate of the second transistor as conductive plates arranged in a common plane.

10. The apparatus of claim 1, wherein the first and second transistors are inverted relative to one another with the source of the first transistor, conductive clip plate and gate of the second transistor as conductive plates arranged in a common plane.

11. The apparatus of claim 1, wherein the apparatus further comprises:
the first transistor being a normally-on power transistor,
the second transistor being configured and arranged to switch between an on-state and an off-state at a lower voltage than a voltage at which the first transistor switches between an on-state and an off-state, and to control the normally-on power transistor in an off-state by applying a voltage to the gate of the first transistor,
the source and the drain of each of the first and second transistors are planar plates;
the drain of the first transistor and the source of the second transistor are on a common substrate and electrically isolated from one another; and
the source of the first transistor and the drain of the second transistor are arranged in a common plane with the conductive clip plate.

12. The apparatus of claim 1, wherein the apparatus is arranged in stacked layers comprising:
a first layer comprising the drain of the first transistor, the source of the second transistor and the gate of the second transistor;
a second layer comprising the respective channels of the first transistor and the second transistor; and
a third layer comprising the source of the first transistor, the conductive clip plate and the drain of the second transistor, the second layer being configured and arranged to control a conductive state of each of the first and second transistors based upon voltages applied to the respective gates.

13. The apparatus of claim 1, wherein the apparatus further comprises:
a first layer comprising respective conductive plates for each of the drain of the first transistor, the source of the second transistor and the gate of the second transistor;
a second layer stacked on the first layer and including the respective channels of the first transistor and the second transistor; and
a third layer stacked on the second layer and including the source of the first transistor, the conductive clip plate and the drain of the second transistor, the second layer being disposed between the first layer and the second layer and configured and arranged therewith to control a conductive state of each of the first and second transistors based upon voltages applied to the respective gates.

14. The apparatus of claim 12, wherein the conductive clip plate, source of the first transistor and drain of the second transistor are conductive plates having upper and lower surfaces defined by a length and a width, and wherein the width of the conductive clip plate is about equal to a width of one of the source of the first transistor and the drain of the second transistor.

15. A method comprising:
forming a first transistor having a gate, a source, a channel and a drain;
forming a second transistor having a gate, and having a stacked source, a channel and a drain; and
forming a connecting structure comprising a conductive clip plate configured to electrically connect the drain of the second transistor to the source of the first transistor, wherein the forming the conductive clip plate further comprises forming a planar plate having respective surface regions that interface with a surface region of the source of the first transistor and with a surface region of the drain of the second transistor, forming a wired or clip-bonded conductor separate from the connecting structure that is configured to electrically connect the source of the second transistor to the gate of the first transistor, and configuring the second transistor with the connecting structure to provide power by controlling the first transistor in an off-state and in an on-state.

16. The method of claim 15, wherein forming the first transistor and forming the second transistor further comprises forming the respective transistors with a gap therebetween, with the source of the first transistor being coplanar with the drain of the second transistor.

\* \* \* \* \*